(12) United States Patent
Ohlsson

(10) Patent No.: US 9,947,829 B2
(45) Date of Patent: Apr. 17, 2018

(54) SUBSTRATE WITH BUFFER LAYER FOR ORIENTED NANOWIRE GROWTH

(75) Inventor: Jonas Ohlsson, Lund (SE)

(73) Assignee: GLO AB, Lund (SE)

(*) Notice: Subject to any disclaimer, the term of this patent is extended or adjusted under 35 U.S.C. 154(b) by 265 days.

(21) Appl. No.: 13/805,273

(22) PCT Filed: Jun. 27, 2011

(86) PCT No.: PCT/SE2011/050845
§ 371 (c)(1),
(2), (4) Date: Jan. 24, 2013

(87) PCT Pub. No.: WO2011/162715
PCT Pub. Date: Dec. 29, 2011

(65) Prior Publication Data
US 2013/0221322 A1    Aug. 29, 2013

(30) Foreign Application Priority Data
Jun. 24, 2010  (SE) ...................... 1050700

(51) Int. Cl.
*H01L 33/12* (2010.01)
*B82Y 10/00* (2011.01)
(Continued)

(52) U.S. Cl.
CPC ............. *H01L 33/12* (2013.01); *B82Y 10/00* (2013.01); *H01L 21/0237* (2013.01);
(Continued)

(58) Field of Classification Search
None
See application file for complete search history.

(56) References Cited

U.S. PATENT DOCUMENTS 6,046,465 A * 4/2000 Wang ...................... H01L 33/10
117/104
6,523,188 B1   2/2003 Kiefer et al.
(Continued)

FOREIGN PATENT DOCUMENTS

JP   2004319711 A   11/2004
JP   2009527913 A    7/2009
(Continued)

OTHER PUBLICATIONS

Kim, Y. J., Lee, J. H., Yi, G. C. Vertically aligned ZnO nanostructures grown on graphene layers. Appl. Phys. Lett. 2009, 95, 213101.*
(Continued)

*Primary Examiner* — Robert Huber
*Assistant Examiner* — Gardner W Swan
(74) *Attorney, Agent, or Firm* — The Marbury Law Group PLLC

(57) ABSTRACT

The present invention provides a substrate (1) with a bulk layer (3) and a buffer layer (4) having a thickness of less than 2 μm arranged on the bulk layer (3) for growth of a multitude of nanowires (2) oriented in the same direction on a surface (5) of the buffer layer (4). A nanowire structure, a nanowire light emitting diode comprising the substrate (1) and a production method for fabricating the nanowire structure is also provided. The production method utilizes non-epitaxial methods for forming the buffer layer (4).

9 Claims, 3 Drawing Sheets

(51) Int. Cl.

| | | |
|---|---|---|
| *H01L 29/06* | (2006.01) | |
| *H01L 33/18* | (2010.01) | |
| *H01L 21/02* | (2006.01) | |
| *B82Y 20/00* | (2011.01) | |
| *B82Y 40/00* | (2011.01) | |
| *H01L 33/00* | (2010.01) | |
| *H01L 33/06* | (2010.01) | |
| *H01L 33/08* | (2010.01) | |
| *H01L 33/24* | (2010.01) | |
| *B82Y 99/00* | (2011.01) | |

(52) U.S. Cl.
CPC .... *H01L 21/0254* (2013.01); *H01L 21/02439* (2013.01); *H01L 21/02444* (2013.01); *H01L 21/02458* (2013.01); *H01L 21/02488* (2013.01); *H01L 21/02513* (2013.01); *H01L 21/02603* (2013.01); *H01L 29/0665* (2013.01); *H01L 29/0676* (2013.01); *H01L 29/0684* (2013.01); *H01L 33/18* (2013.01); *B82Y 20/00* (2013.01); *B82Y 40/00* (2013.01); *B82Y 99/00* (2013.01); *H01L 33/007* (2013.01); *H01L 33/06* (2013.01); *H01L 33/08* (2013.01); *H01L 33/24* (2013.01); *Y10S 977/762* (2013.01)

(56) References Cited

U.S. PATENT DOCUMENTS

| | | | |
|---|---|---|---|
| 6,617,060 B2 | 9/2003 | Weeks, Jr. et al. | |
| 6,818,061 B2 | 11/2004 | Peczalski et al. | |
| 7,335,908 B2 | 2/2008 | Samuelson et al. | |
| 7,365,374 B2 | 4/2008 | Piner et al. | |
| 7,829,443 B2 | 11/2010 | Seifert et al. | |
| 2003/0039866 A1* | 2/2003 | Mitamura | C23C 14/0617 428/698 |
| 2004/0096574 A1* | 5/2004 | Hsieh et al. | 427/126.1 |
| 2007/0034892 A1* | 2/2007 | Song | 257/103 |
| 2007/0257264 A1 | 11/2007 | Hersee et al. | |
| 2008/0036038 A1 | 2/2008 | Hersee et al. | |
| 2008/0191191 A1 | 8/2008 | Kim | |
| 2008/0191203 A1* | 8/2008 | Fujioka | C23C 14/0617 257/43 |
| 2008/0258133 A1* | 10/2008 | Seong | 257/14 |
| 2009/0278136 A1* | 11/2009 | Beaumont | C30B 25/02 257/76 |
| 2010/0096614 A1* | 4/2010 | Kim et al. | 257/13 |
| 2010/0270892 A1* | 10/2010 | Ahn | H01L 41/094 310/368 |

FOREIGN PATENT DOCUMENTS

| | | |
|---|---|---|
| JP | 2009542560 A | 12/2009 |
| JP | 2010518615 A | 5/2010 |
| WO | 2004/004927 A2 | 1/2004 |
| WO | 2007/102781 A1 | 9/2007 |
| WO | 2008/085129 A1 | 7/2008 |
| WO | 2009/096932 A1 | 8/2009 |

OTHER PUBLICATIONS

Dhumal, SY and Kommu, S. A theoretical and experimental study of stresses responsible for the SOI wafer warpage. ECS Transactions, 16(6), (2008) 57-62.*

Patsalas, P et al. The effect of substrate temperature and biasing on the mechanical properties and structure of sputtered titanium nitride thin films. Surf. Coat. Technol., 125 (2000) 335-340.*

Ji, H., Kuball, M., Burke, R. A., and Redwing, J. M. Vibrational and optical properties of GaN nanowires synthesized by Ni-assisted catalytic growth. Nanotechnology, 18 (2007).*

Gabriel, N. T., Kim S. S., and Talghader, J. J., Control of thermal deformation in dielectric mirrors using mechanical design and atomic layer deposition. Optics Lett. 34 (2009) 1958-1960.*

Heon-Jin Choi et al, The role of GaN/AlN double buffer layer in the crystal growth and photoluminescence of GaN nanowires, Chemical Physics Letters 413 (2005) 479-483.; whole document; abstract.

O. Landre et al, Growth mechanism of catalyst-free [0001] GaN and AlN Nanoires on Si by molecular beam epitaxy, Phys. Status Solidi C 7, No. 7-8, sid 2246-2248, Apr. 30, 2010.; whole document; abstract; Chapters 2.1, 3.

W.I.Lee, Wide bandwith AlAs/AlGaAs tandem Bragg reflectors grown by organometallic vapor phase epitaxy Appl. Phys. Lett. 67, 3753-3755 (1995); whole document; abstract.

Won Mook Cho et al, Selective growth of ZnO Nanorods on SiO2/Si Substrates Using a Graphene Buffer Layer, Nano Res, May 2011, 4(5) pp. 440-447; whole document; abstract.

Yan-Ru Lin et al, Buffer-Facilitated Epitaxial Growth of ZnO Nanowire, Crystal Growth & Design 2005 vol. 5, No. 2 pp. 579-583.; whole document; abstract; Chapters: Introduction, Experimental section.

International Search Report & Written Opinion issued in PCT Application No. PCT/SE2011/050845, dated Nov. 28, 2011.

International Preliminary Report on Patentability issued in PCT Application No. PCT/SE20011/050845, dated Jan. 10, 2013.

European Office Communication pursuant to Rules 70(2) and 70a(2) for European Patent Application No. 11798484.9, dated May 22, 2015, (1 Sheet).

Extended Supplementary European Search Report for for European Patent Application No. 11798484.9, complete Apr. 24, 2015 (6 Sheets).

* cited by examiner

Prior Art

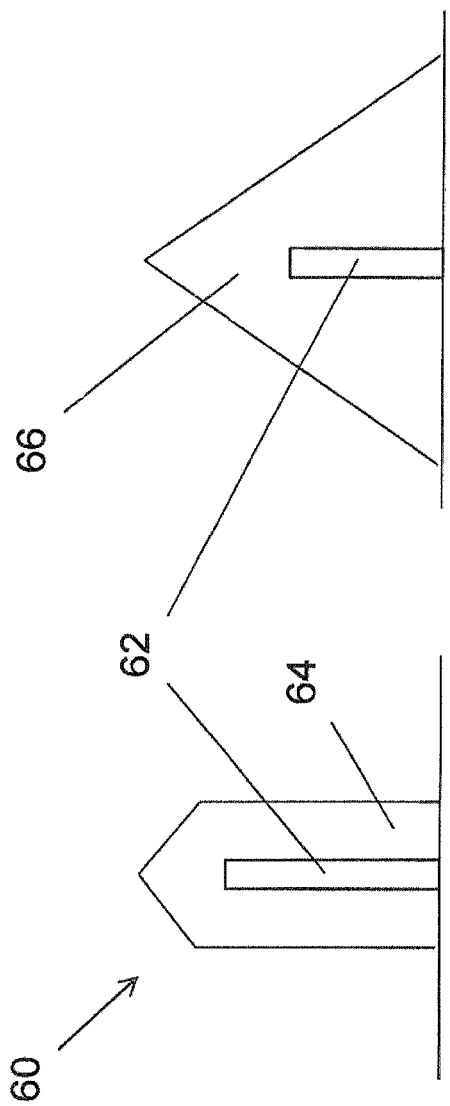

SUBSTRATE WITH BUFFER LAYER FOR ORIENTED NANOWIRE GROWTH

CROSS-REFERENCE TO RELATED APPLICATIONS

This application is a National Stage application of PCT International Application Serial No. PCT/SE2011/050845, filed Jun. 27, 2011, which claims priority from Swedish Application No. 1050700-2, filed Jun. 24, 2010.

TECHNICAL FIELD OF THE INVENTION

The present invention relates to nanowire based devices and in particular to substrates for nanowire growth.

BACKGROUND OF THE INVENTION

In nanowire based devices, such as nanowire based light emitting diodes (LEDs), a multitude of nanowire based structures are usually arranged in ordered arrays on a substrate. The substrate often has multiple purposes, i.e. being a template for nanowire growth, being a carrier for the nanowires in the device and electrically connecting the nanowires on one side thereof. Different techniques for growth of the ordered arrays of nanowire based structures, where all structures are parallel and oriented in the same direction, are known. For example, semiconductor nanowires may be epitaxially grown on a high quality, mono-crystalline, semiconductor layer of the substrate, typically by selective area growth with a patterned growth mask arranged on the substrate, as described in e.g. WO 2007/102781. Another common method is the so called VLS (vapour-liquid-solid) technique where a pattern of catalytic particles, often Au, is used as seeds to grow the nanowires, as described in U.S. Pat. No. 7,335,908.

Nitride semiconductors, such as GaN InN and MN and their GaInN, GaAlN, and GaInAlN combinations of various composition are used in blue, green and UV LEDs and other optoelectronic applications due to their wide and direct bandgap. Typically, in these devices nitride semiconductors are grown in planar layers on a substrate. However, mismatch between substrate and the nitride semiconductors, for example lattice mismatch, introduce detrimental defects such as cracks in the grown material. In prior art, dislocations have been suppressed by using epitaxial substrates or substrates with an epitaxial buffer layer. Commercial GaN based devices utilize sapphire, Si or SiC substrates, which, are highly lattice mismatched to GaN, and hence several μm thick buffer layers are epitaxially grown on the substrates in order to function as a strain accommodating layers and a high quality epitaxial foundation to grow the device on. Examples of the use of epitaxial buffer layers can be found in the following documents.

U.S. Pat. No. 6,523,188 B2 discloses epitaxial growth of an epitaxial buffer layer made of AlN on a Si (111) substrate before growing the GaN layer to compensate for the large lattice mismatch between GaN and Si. The epitaxial buffer layer is preferably less than 0.2 μm in order to obtain a flat GaN layer.

In U.S. Pat. No. 6,818,061 B2 discloses epitaxial growth of a thin epitaxial buffer layer including AlN with a thickness of about 40 nm on a Si (111) substrate before growing the GaN layer to compensate for the large lattice mismatch between GaN and Si. Moreover, the GaN layer includes interlayers with alternating AlN and GaN layers.

In U.S. Pat. No. 6,617,060 B2 it is disclosed that a compositionally graded transition layer made of a GaN alloy between a Si substrate and a GaN layer, and optionally additionally a thin epitaxial strain accommodating layer that generally has a constant composition throughout its thickness, can be used to prevent crack formation in the GaN layer. Without this compositionally graded transition layer cracks can not readily be prevented.

U.S. Pat. No. 7,365,374 B2 discloses the use of a strain absorbing layer on a substrate. The strain absorbing layer should have a thickness of less than 10 nm so that overlying layers have an epitaxial relation ship with the underlying substrate.

It is appreciated from the above examples that in prior art methods the buffer layer is grown by epitaxial growth methods in order to form thick single crystalline, high quality, epitaxial buffer layers. Together with the GaN device layer grown on the epitaxial buffer layer an epitaxial layer with a thickness of more than 3 μm is formed.

Recently the use of nitride semiconductors for nanowire based devices has received considerable attention since the nanowires enable growth of nitride semiconductor materials with low defect density, as described in WO 2008/085129 A1. However, even if nanowires are used, the growth of high-quality nitride semiconductors, for example GaN, is performed using high-quality epitaxial layers as templates. The use of epitaxial layers of high quality ensures an optimal epitaxial template for nanowire growth, minimizes the density of defects that may continue up in the nanowires, and enables low electrical resistance between the substrate and nanowires. However, a buffer layer in accordance with prior art introduces substrate bowing due to the strain, which radically alters the thermal profile over the substrate. For nanowire growth, high thermal uniformity on the substrate during growth is crucial for fabrication of nanowire structures such as LEDs. The problem of substrate bowing is enhanced by increasing size of the substrate, in this way being an obstacle for large-scale processing of GaN devices on large substrates. Growth of the buffer layer is a time consuming procedure and often thick AlN is used in the buffer layer, which limits the vertical conductivity. Moreover, for many optoelectronic devices, for example LEDs the substrate is often removed, leaving only the buffer layer in the final device, whereby the costly substrate material only is used for the growth step.

In LEDs, reflectors may be used under the light emitting region to direct light out from the LED. Most common is the use of metal reflectors, as Ag mirrors. Bragg reflectors comprise repeated epitaxial semiconductor layers with different refraction index forming a. Bragg reflectors are limited in their reflectivity over a narrow span of wavelength and incident light angle and are not suitable for devices emitting light in a wider wavelength region. The narrow optimal wavelength window is less of a problem as LEDs do emit light of narrow wavelength. However, growth of Bragg reflectors is time consuming, and particularly challenging on lattice mismatched substrates, since the crystal quality has to be high to make efficient reflectors.

SUMMARY OF THE INVENTION

In view of the foregoing one object of the invention is to provide substrates for growing a multitude of nanowires oriented in the same direction, which substrates do not require costly and time consuming epitaxy and enable use of different substrate materials than used today. In particular one object of the invention is to allow use of materials formed with higher defect and dislocation density than commonly obtained with epitaxial growth techniques.

The objects of the invention are achieved by the substrate and the method as defined in the independent claims.

A substrate in accordance with the invention comprises a bulk layer and a buffer layer arranged on the bulk layer for growth of a multitude of nanowires oriented in the same direction on a surface of the buffer layer. The thickness of the buffer layer that is deposited on the substrate is preferably less than 2 µm. In prior art buffer layers of substrates for growing nanowires the strain compensating buffer layer thickness is in the range of 3-10 µm, and grown using epitaxy in order to provide as high crystal quality to the buffer layer as possible.

The substrate can be used to form a structure comprising one or more nanowire based structures protruding from the buffer layer. This structure can be a nanowire based light emitting diode structure where the nanowire based structures are utilised for light generation.

A method according to the invention for forming a structure comprises a multitude of nanowires oriented in the same direction in accordance with the invention comprises the basic steps of: providing a bulk layer; depositing a buffer layer with a thickness of less than 2 µm on the bulk layer; and growing one or more nanowires on the buffer layer.

The invention includes, but is not limited to sub-µm thickness nitride, oxygen and carbon containing buffer layers on substrates such as sapphire, quartz and Si. The buffer layers may include a reflector part and they may be laterally conducting in order to be integrated electronically with the nanowire devices.

The invention furthermore teaches how to fabricate large area wafers with heavily reduced bow, as compared to previous buffer layers for nanowires. Here expressed in curvature, with measured wafer curvature less than 50 km$^{-1}$, preferably less than 40 km$^{-1}$, in some embodiments the curvature is less than 30 km$^{-1}$ preferably less than 20 km$^{-1}$.

The inherent one-dimensional nature of nanowires makes it rational to argue that growth of nanowires should be possible on other substrate materials or substrates of lower quality. While this may not have been proven yet, it has, for example in WO 2004/004927 A2, been shown that nanowires have a much higher capacity to adapt for highly lattice mismatched axial variations without introducing crystal defects than structures of the same composition grown in planar mode. Thanks to the invention it is possible to use buffer layers that have lower crystalline quality and even polycrystalline buffer layers.

Properties of the buffer layer can be divided into device enhancing properties and growth enabling properties. Depending on end use and final configuration of the device parameters as, thermal conductivity, CTE, transparency, refraction index, absorption and electrical conductivity are of importance. The growth enabling properties are thermal resistance to the used growth temperature, the capacity of the substrate to provide a generic direction to multiple nanowires, strain induced bowing of the substrate and the possibility to nucleate the NW material on the substrate. Nitride based III-V semiconductors have been shown to be possible to nucleate on many materials comprising N, O, or C. However, the nucleation step in itself cannot always be made in an oriented-constrained manner, so usually it is convenient to keep this step as short as possible.

Traditionally, buffer layers for planar and selectively grown nitride based semiconductor devices, of devices have been, thick, epitaxially grown, often in multiple steps, comprising multiple III-N materials, all to increase device performance. Device quality has been directly dependent of crystalline quality of the substrate. Then substrate material choices have also been limited to the use of high crystalline materials of SiC, Si and Al2O3 with choice of substrate directly determining buffer layer quality and therefor device quality.

One advantage with the buffer layer in the substrate of the invention is that material choices and material sequences of the substrates are appreciably relaxed, creating new options to electrically integrate the substrate with the nanowire array and enabling the use of non-Bragg reflectors or multi-wavelength Bragg reflectors in the substrate.

By being able to use partly crystalline buffers with partly directional properties only, the possible choices of substrate material have been further increased, where buffer layer materials that do not even need directional information from the substrate are used, such as AlN, some Carbon films, TiN and similar.

While using our proprietary nanowire fabrication method described herein as described for example in U.S. Pat. No. 7,829,443, to Seifert et al., incorporated herein by reference for the teaching of nanowire fabrication methods, we have found that we can lessen the above described constraints to the buffer layer and therefore also the substrate. This may be possible to achieve with other nanowire growth methods although this has not been investigated by us.

A full understanding of the mechanisms enabling this invention is not yet achieved. However, the unique directionality of the NW growth in combination with the small width of the nanowires, giving the crystal the option to deflect or redirect defects at an early stage of growth is understood to play major roles. Energy minimization of the crystal is achieved with increased crystal perfection. The possibilities for the crystal to relax in all directions during growth together with the proximity of surfaces to consume dislocations are understood to be of importance.

Another advantage with the invention is that no thick strain compensating buffer layer has to be used for the nanowire growth. With a thick strain compensating buffer layer the processing often suffers from bowing of the substrate, which may crack the substrate or at least introduce non-uniform growth conditions over the substrate that deteriorate the performance of the final device.

It is a further advantage of the invention that it makes it possible to grow oriented nanowires on cheaper substrates, such as Si (111) substrates, and in particular Si (100) substrates, but also amorphous substrates, the main prerequisite being the substrate being able to resist the chosen process temperatures.

Another advantage of the invention is to provide substrates for growing nanowires that can remain in the final device. For example, as mentioned above, in LED structures the substrate is usually removed since it cannot be used in the device, or due to insufficient thermal properties. With for example Si substrates the substrate can remain and be used.

Yet another advantage with the invention is that costly and time consuming epitaxy steps in the processing are avoided.

Thanks to the substrate for growing nanowires and the method for growing nanowires of the invention, the next step in development of nitride based semiconductor devices, and in particular GaN-based devices, such as LEDs, will be possible.

Thus, in one aspect the invention provides a nanowire LED structure, wherein each nanowire in use contributes to the formation of an active region for generation of light.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein FIG. 1 schematically illustrates a nanowire structure with a substrate in accordance with prior art, FIG. 2 schematically illustrates a nanowire structure with a substrate in accordance with the invention, FIG. 3 schematically illustrates a nanowire structure comprising a multilayer structure in the buffer layer in accordance with the invention, FIG. 6 illustrates schematically a nanostructure comprising a core and a shell.

DETAILED DESCRIPTION OF EMBODIMENTS

Figure 1:
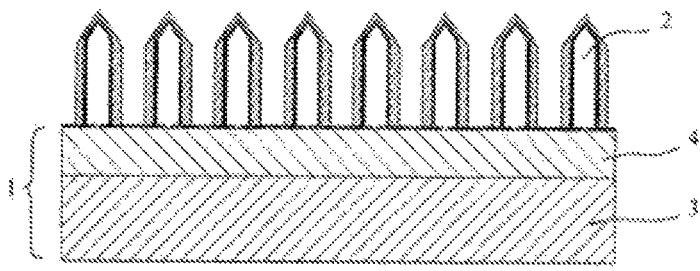

All references to vertical, lateral etc. are introduced for the ease of understanding only, and should not be considered as limiting to specific orientation. Furthermore, the dimensions of the structures in the drawings are not necessarily to scale.

Although the preferred embodiment of the invention in the following are described mainly in terms of nanowire light emitting diodes (LEDs) and the needs for such structures it should be appreciated that the substrates and buffer layers of the invention and the nanowire growth thereon can be used to fabricate other optoelectronic devices and electronic devices and to fulfill the needs thereof.

For LEDs nitride-based semiconductor materials are of great interest at least for the part of the device that generates the light. Typical GaN nanowire LED fabrication includes elevated growth temperatures around 1000 deg C. Substrate/buffer layer materials must be chosen according to this thermal envelope. Examples of such materials are $Al_2O_3$ (isolator), AlN, GaN, Si, (semiconductors), and W (metals). Extra precautions have to be taken with adjacent combinations of layers that may form a eutectic binary compound with a melting point much lower than 1000 degrees C. Intermediate layer combinations may then be used as barrier layers. Since the skilled person is familiar with these risks these barrier layers are not explicitly disclosed in the embodiments.

Figure 2:
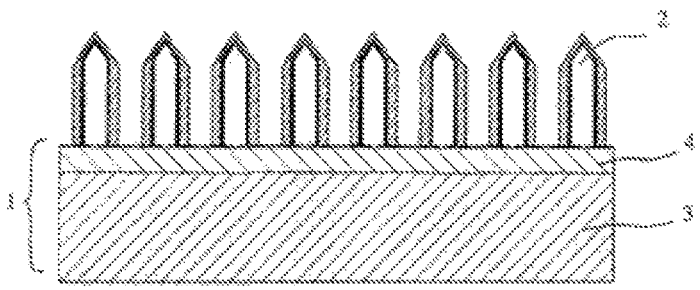

FIG. 1 schematically illustrates a prior art nanowire based structure comprising a substrate 1 with a bulk layer 3 having a thickness in the range of 20-1000 μm and a epitaxial strain accommodating buffer layer 4 having a thickness in the range of 3-10 μm. Nanowires 2 protrude from the buffer layer 4. The nanowires 2 are aligned in one direction which is determined by the crystal orientation of the buffer layer 4. FIG. 2 schematically illustrates a structure in accordance with the invention comprising a substrate 1 with a bulk layer 3 having a thickness in the range of 20-1000 μm and a epitaxial strain accommodating buffer layer 4 having a thickness of preferably less than 2 μm, more preferably in the range of 0.2-2 μm. Nanowires 2 protrude from the buffer layer 4. The nanowires 2 are aligned in one direction which is determined by the orientation of the buffer layer 4.

The general crystal structure of the buffer layer is often the same or at least similar to the nanowire crystal structure. It is however the atomic configuration of the buffer layer structure that in the end forces the nanowires to grow unidirectionally. Alteration of preferred general alignment of nanowires can be realized with process steps, as explained in the following. In such cases the orientation of the nanowire crystal is usually adapted to the buffer layer crystal orientation.

By way of example, in the structure in FIG. 2 the nanowire based structures comprise a radial core-shell structure forming a nanowire based LED structure. The core-shell structure may comprise an n-type GaN nanowire core and a p-type GaN shell with an intermediate quantum well layer comprising sub-layers of AlGaN, InGaN and/or GaN. FIG. 2 illustrates nanowires grown using selective area growth using a growth mask, however not limited to this.

Figure 3:
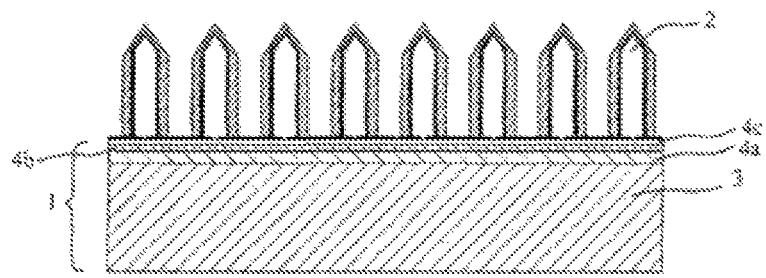

FIG. 3 schematically illustrates one embodiment of the invention comprising a buffer layer 4 with one or more sub-layers 4a, 4b, 4c. The buffer layer 4 or said one or more sub-layers 4a, 4b, 4c may comprise semiconductor materials, metal/metal alloys and/or insulators in different layers. Non-epitaxial materials with orientational properties that improve thermal properties of the device, can withstand the growth temperatures are preferred, exemplified, but not limited to AlN, TiN, graphene, and other polycrystalline or partly amorphous carbon films.

In one embodiment of the invention the buffer layer or each of the sub-layers has a homogeneous composition throughout its thickness. At least the composition is not intentionally varied.

Different materials can be combined to obtain desired optical and/or electrical properties. For example one or more reflector layers may be included in the sub-layer stack of the buffer layer 4. The electrical conductivity in vertical and lateral direction can also be tailored, for example in order to have a high conductivity in the lateral direction to provide a current spreading layer connecting the nanowires of the structure.

The nanowire structures are electrically connected by a common lateral contact formed by the buffer layer 4 or at least one of said one or more sub-layers 4a, 4b, 4c.

There are several deposition methods available that may be used for formation of the buffer layer 4 or the sub-layers 4a, 4b, 4c when low defect densities and high crystal perfection are not needed. Different deposition methods may be used for different sub-layers.

Buffer layers deposited by atomic layer deposition (ALD) have excellent orientation properties.

Plasma-enhanced chemical vapor deposition (PECVD), low pressure chemical vapor deposition (LPCVD) and atmospheric pressure chemical vapor deposition (APCVD) can be used. For example, oriented AlN can been grown with LPCVD and APCVD, graphene, and other polycrystalline or partly amorphous carbon films can also be deposited by utilizing LPCVD or RF-CVD. Generally PECVD has inferior orientation capacity as compared with the other two.

Physical vapor deposition techniques based on sputtering or evaporation can also be used, however sputtering is usually not feasible for oriented deposition. Vacuum evaporation methods are often preferred for oriented deposition of metals or metal alloys. A good example is aluminum layers that easily are grown/evaporated with uniform (111) orientation perpendicular to the substrate although it usually is polycrystalline with high variation of grain size. However, the low melting point at 660 deg C. limits the used of aluminum.

Lattice mismatched layers can also be grown with epitaxial methods. Epitaxy methods such as metal organic chemical vapor deposition (MOCVD) or hydride vapour phase epitaxy (HVPE) are usually used to fabricate crystals and crystal interfaces of very high perfection. However, when used for growth on lattice mismatched substrates, the dislocation densities of the layers are high. The buffer layer 4 or one or more of the sub-layers 4a, 4b, 4c can have a defect or dislocation density higher than $10^{-10}/cm^2$ and still be used for commercial devices.

Layer quality can be increased to a certain extent by growing thick strain accommodating buffer layers, often at low temperature. Without the constraint of crystal perfection thick strain accommodating buffer layers are made redundant.

Oxidation of oriented buffer layers can preserve the orientation of the original substrate. An illustrating example is evaporated aluminum that can be oxidized to $Al_2O_3$ with preserved orientation. However, deposition of a buffer layer can also alter the orientation.

A method for forming a structure comprising a multitude of nanowire structures oriented in the same direction, wherein the method comprises the steps of:
providing a bulk layer 3;
depositing a buffer layer 4 with a thickness of less than 2 μm on the bulk layer 3; and
growing one or more nanowires 2 on the buffer layer 4.

The method of the invention enables the fabrication of both Bragg reflectors and normal reflector layers. Bragg reflectors made by deposition, i.e. not epitaxy, are easier and cheaper to fabricate than epitaxial Bragg reflectors. This method is therefore suitable for fabrication of multi colored devices, using multiple, stacked Bragg reflectors, formed by a plurality of sub-layer, each Bragg reflector reflecting a separate light emitting wavelength, used in conjunction with colored light emitting sources on top of the substrate. However, each Bragg reflector, adds approximately 0.5 μm to the thickness of the buffer layer, making the buffer layer thicker than in single colored devices.

The deposition methods are exemplified above. In principle there are two types of deposition in accordance with the invention: (i) preservation of orientation of bulk layer; and (ii) creation of an oriented buffer layer for growth of nanowires with predetermined crystal orientation on bulk layers, i.e. commonly denoted substrates, without preferential orientation or with different orientation.

In the first type (i) semiconductor nanowires are commonly grown in the (111) (cubic zinc blende) or (0001) (hexagonal wurtzite) direction. For oriented growth of nanowire arrays a (111) or (0001) substrate is usually used, so that the nanowires will be oriented perpendicularly to the substrate surface. Controlled deposition of materials on crystalline substrates with respect to orientation will facilitate preserving the orientation, which facilitates orientated growth on multi-layered structures.

In the second type (ii), for some materials and deposition methods, such as MN fabricated with LPCVD or APCVD, or vacuum evaporated Al, the material layers themselves tend to align in a predominant (111) direction. This is also true for TiN, where many large area deposition methods are available. The use of such materials increases the freedom of choice for the underlying layers as the directional information can be introduced in the last layers, which is designated for nanowire nucleation Although nanowires may be nucleated on a variety of materials, homogeneous nucleation is greatly facilitated by growing them on similar material substrates. For nitride based structures, such as GaN nanowires, optimal substrate surfaces for growth are nitride based semiconductors such as GaN, InN or AlN and combinations thereof. AlN, but also TiN, also allows adjacent sub-layers of SiO, TiO or SiN.

Preferential termination layers AlN or a sequence of GaN and AlN can easily be grown with ALD, CVD and MOCVD methods. In this case the AlN or TiN can be used to enhance directional information while addition of Ga into the terminating surface layer will enhance nucleation homogeneity.

By depositing a layer of grapheme, polycrystalline carbon or partly amorphous carbon, using for example LPCVD, for growing nanowires a growth direction perpendicular to the substrate can be obtained. The reason for this is the crystallographic properties of high temperature resistant carbon films i.e., providing grains of diamond-like or graphene like material. A special nucleation step and nucleation temperature is often required in order to initiate growth of ionic material such as GaN on material such as Si or C. However, the nucleation step will often lessen the directional constraint to the growth conditions and should usually be kept short. The grain structure may help to relax lattice strain between the nanowire and the film although a "too random" grain structure will limit directional properties and temperature resistance of the film. Further advantages of using carbon films in the buffer layer or in one or more sub-layers of the buffer layer are their excellent heat conducting properties as well as their inherent transparency.

WO 2008/085129 relates to nitride nanowires and method of producing such. The methods of that application can be implemented for growth on buffer layers in accordance with the present invention. In particular, nitride based semiconductor nanowires can be accomplished on a buffer layer in accordance with the invention by a selective area growth technique wherein the nitrogen source flow rate is substantially constant during nanowire formation. By altering the III/V-ratio during growth a shell layer that at least partly encloses the nanowire can be obtained. Thanks to the invention it is possible to use the method of WO 2008/085129 to grow nanowires on cheaper substrates, such as Si substrates, and with buffer layers that are not single crystalline or with extremely low levels of defects.

Figure 4:
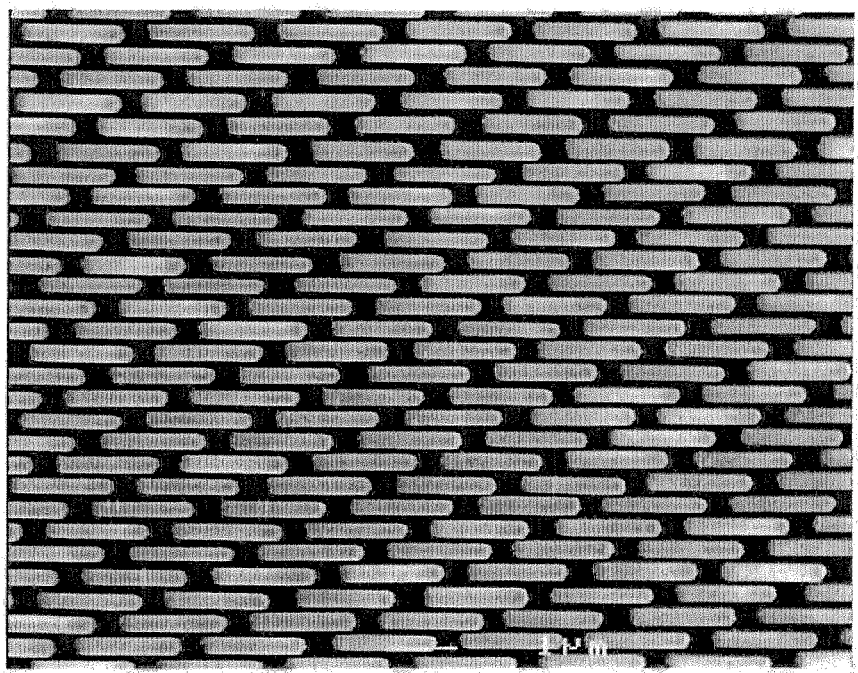
FIG. 4 shows a nanowire array of GaN nanowires formed on a low quality buffer layer on a Si substrate in accordance with the invention.

FIG. 4 shows a nanowire array of GaN nanowires formed on a low quality buffer layer on a Si substrate in accordance with the invention.

Figure 5:
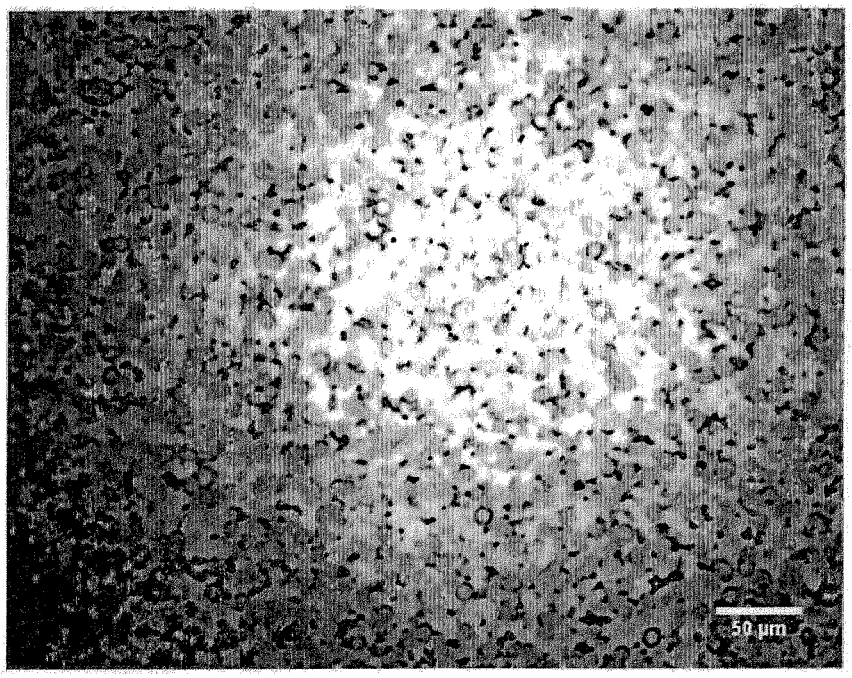
FIG. 5 shows a low quality buffer layer in accordance with the invention.

FIG. 5 shows a low quality buffer layer in accordance with the invention.

In one embodiment of the invention a selective area growth technique utilizing holes in a mask layer arranged on the buffer layer in accordance with the invention functioning as apertures for nanowire growth is used. The selection of hole diameter is important for obtaining single crystalline, dislocation free nanowires. If the hole diameter is too large the nanowires may be too wide to be able to repel dislocations, or may not be single crystalline. The critical hole diameter depends on the buffer layer quality and composition as well as the composition of the nanowire and conditions during nanowire nucleation and growth, but generally the hole diameter is preferably less than 200 nm, more preferably less than 150 nm. In embodiments of the invention the hole diameter is also preferably less than 100 nm, more preferably less than 50 nm.

Although the fabrication method described herein preferably utilizes a nanowire core to grow semiconductor shell layers on the cores to form a core-shell nanowire based structure forming a LED, as described for example in U.S. Pat. No. 7,829,443, to Seifert et al., incorporated herein by reference for the teaching of nanowire fabrication methods, it should be noted that the invention is not so limited. For example, as will be described below, in the alternative embodiments, only the core may constitute the nanostructure (e.g. nanowire) while the shell may optionally have dimensions which are larger than typical nanowire shells. Furthermore, the device can be shaped to include many facets, and the area ratio between different types of facets may be controlled. This is exemplified in FIG. 6 by the "pyramid" facets and the vertical sidewall facets. FIG. 6a shows a pillar shaped nanostructure 60 comprising a nanowire core 62 and a shell 64, and FIG. 6b shows another variant where the shell is grown on a nanowire core 62 so as to form a pyramid 66. It should be noted that FIG. 6 is only a schematic illustration, and is not to scale, and the shell while shown as a single layer could comprises several layers. The LEDs can be fabricated so that the emission layer formed on templates with dominant pyramid facets or sidewall facets. The same is true for the contact layer, independent of the shape of the emission layer.

The use of sequential (e.g., shell) layers gives that the final individual device (e.g., a pn or pin device) may have a shape anywhere between a pyramid shape (i.e., narrower at the top or tip and wider at the base) and pillar shaped (e.g., about the same width at the tip and base) with circular or hexagonal or other polygonal cross section perpendicular to the long axis of the device. Thus, the individual devices with the completed shells may have various sizes. For example, the sizes may vary, with base widths ranging from 100 nm to several (e.g., 5) μm, such as 100 nm to below 1 micron, and heights ranging from a few 100 nm to several (e.g., 10) μm.

With the methods according to the invention it is possible to make large area wafers with heavily reduced bow, as compared to previous buffer layers for nanowires. The bow is herein expressed as curvature, with measured wafer curvature less than 50 km$^{-1}$, preferably less than 40 km$^{-1}$, in some embodiments the curvature is less than 30 km$^{-1}$ preferably less than 20 km$^{-1}$. Curvature as used herein is defined in an article by E. armour et al, "LED growth compatibility between s", 4" and 6" sapphire" in "Semiconductor TODAY Compounds & advanced Silicon", Vol. 4, Issue 3, April/May 2009, p 82-86, the article being incorporated herein in its entirety by reference (see FIG. 4 therein).

Thus, Bow (B) and Curvature (K) are related as follows:

$$K=1/R$$

$$B=K*D^2/8$$

wherein

R is the radius of the curvature of the wafer, and

D is the diameter of the substrate (e.g. 2, 4 or 6 inches)

While the invention has been described in connection with what is presently considered to be the most practical and preferred embodiments, it is to be understood that the invention is not to be limited to the disclosed embodiments, on the contrary, it is intended to cover various modifications and equivalent arrangements within the scope of the appended claims.

The invention claimed is:

1. A method for forming a structure comprising a plurality of nanowires oriented in the same direction, wherein the method comprises the steps of:
   providing a bulk layer;
   depositing a buffer layer with a thickness of less than 2 μm on the bulk layer, wherein the buffer layer is polycrystalline or amorphous and is formed by depositing two or more sub-layers, wherein the buffer layer is a non-epitaxial material selected from the group consisting of AlN and TiN, and combinations thereof, can withstand growth temperatures, and is grown with orientational properties that improve thermal properties of the structure; and
   growing one or more GaN nanowires on the buffer layer.

2. The method of claim 1, wherein the deposition of the buffer layer preserves the orientation of the bulk layer.

3. The method of claim 1, wherein the deposition of the buffer layer alters the orientation of the bulk layer.

4. The method of claim 1, wherein the buffer layer or one or more of the sub-layers are deposited by LPCVD, APCVD or PECVD.

5. The method of claim 1, wherein the buffer layer or one or more of the sub-layers are deposited by ALD.

6. The method of claim 1, wherein the buffer layer or one or more of the sub-layers are deposited by PVD.

7. The method of claim 1, wherein the buffer layer or one or more of the sub-layers are grown by MOVPE or HVPE.

8. The method of claim 1, further comprising forming a masking layer on the buffer layer, forming holes in the masking layer, and growing one or more nanowires on the buffer layer through the holes.

9. The method of claim 1, wherein the buffer layer does not comprise silicon nitride.

* * * * *